United States Patent [19]

Ammon et al.

[11] 4,376,339
[45] Mar. 15, 1983

[54] METHOD AND APPARATUS FOR ORIENTING INTEGRATED CIRCUIT CLIPS AND SOCKETS AND ASSEMBLING THEM INTO CONNECTOR CONTACTS

[75] Inventors: J. Preston Ammon; Harry R. Weaver; Evan Evans, all of Dallas, Tex.

[73] Assignee: ELFAB Corporation, Addison, Tex.

[21] Appl. No.: 187,499

[22] Filed: Sep. 15, 1980

[51] Int. Cl.³ .................. H01R 43/00; B23P 19/00
[52] U.S. Cl. ...................................... 29/876; 29/747; 198/446; 198/651; 221/167; 221/173; 414/754
[58] Field of Search ............... 29/428, 430, 451, 453, 29/464, 468, 747, 876; 198/446, 651; 221/163, 167, 171, 173, 208, 268; 414/404, 416, 675, 759; 339/256 R, 258 R

[56] References Cited

U.S. PATENT DOCUMENTS

| | | | |
|---|---|---|---|
| 2,779,094 | 1/1957 | Christoffel | 29/874 X |
| 3,468,024 | 9/1969 | Yonkers | 29/428 X |
| 3,922,057 | 11/1975 | Lemke et al. | 339/256 R X |
| 4,186,990 | 2/1980 | Bertoglio | 339/258 R |
| 4,257,667 | 3/1981 | Iantorno | 339/256 R X |

Primary Examiner—Francis S. Husar
Assistant Examiner—Carl J. Arbes

[57] ABSTRACT

A plurality of integrated circuit lead clips having a circular top opening and four resilient planar tines are positioned in a holding fixture in a rectangular matrix array. A carrier strip including a plurality of equally spaced, transversely extending projections each having a generally rectangular cross-section is positioned above a row of clips positioned in the fixture. The strip is vibrated and then lowered to pass one projection into the top opening of each clip and through the four resilient planar tines. Vibrations of the projections at the same time the tips of the projections touch the clips causes the clip to rotate in the fixture so that the planar ends of the tines orient with respect to the four flat sides of each projection. The projections are pushed through the clips so that they are held to the projections by the resiliency of the tines. Once the clips are oriented and affixed to the projections on the carrier strip they may be installed directly into mounting apertures, such as plated holes in a printed circuit board, or inserted into oriented integrated circuit connector contacts.

32 Claims, 25 Drawing Figures

U.S. Patent Mar. 15, 1983 Sheet 1 of 7 4,376,339
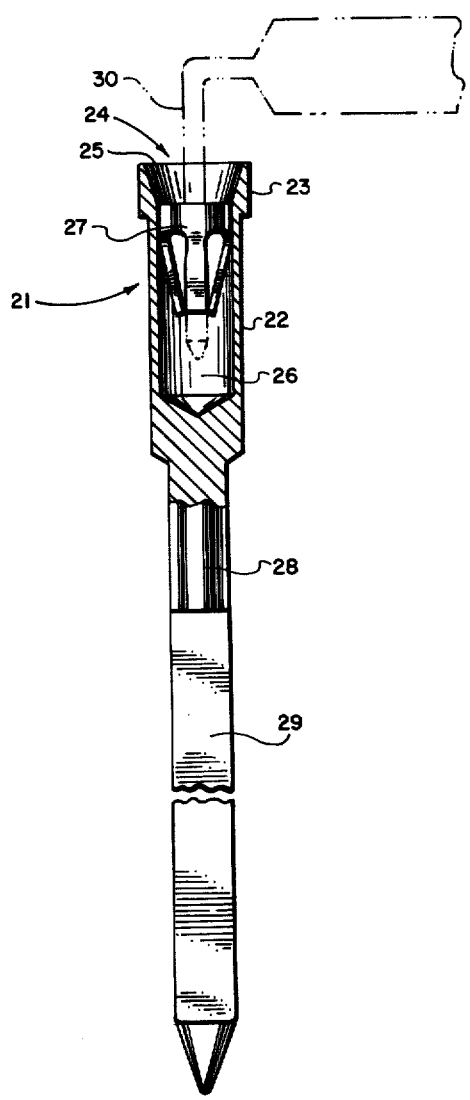
FIG. 1
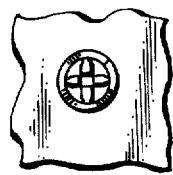
FIG. 3A
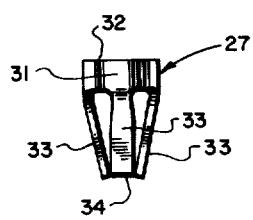
FIG. 3B
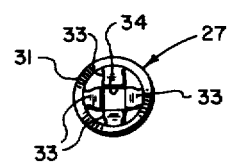
FIG. 2
FIG. 3

METHOD AND APPARATUS FOR ORIENTING INTEGRATED CIRCUIT CLIPS AND SOCKETS AND ASSEMBLING THEM INTO CONNECTOR CONTACTS

BACKGROUND OF THE INVENTION

1. Field of the Invention

The invention relates to the manufacture of integrated circuit connector contacts and, more particularly, to a method and apparatus for rotationally orienting clips and sockets. Carrier strip mounted oriented clips may be used alone or brought together with oriented sockets onto a carrier strip while maintaining the orientation to facilitate subsequent processing and shipment.

2. History of the Prior Art

Integrated circuit connector contacts are used to make both electrical and mechanical interconnection with the leads of an integrated circuit package, which leads are generally rectangular in cross-section. Such contacts conventionally include a cylindrical upper socket portion having a cylindrical top opening for receiving integrated circuit package leads and a downwardly extending tail portion for mounting the socket onto a mounting substrate and/or for interconnecting the contact with wiring. Each integrated circuit connector contact also includes a small circular clip including resilient tines, fitted into the cylindrical top opening for gripping a package lead inserted therein. The clip is open at the top and includes a cylindrical upper portion and four inwardly and downwardly extending resilient tines. The tip ends of each of the tines are square, orthogonal to one another, and form a generally square opening at the lower end of the clip. It is highly desirable for the clip to be rotationally oriented with respect to an axially extending rectangular circuit lead so that the four straight lower edges of the tines are in flush parallel engagement with the flat rectangular faces of the integrated circuit package leads. Rotational disorientation of the tines of the clip with respect to the leads to be inserted and connected renders the interconnection unreliable as well as decreases the consistency of the push-in and push-out forces required to insert and withdraw the leads from the contact.

The majority of the integrated circuit connector contact sockets are manufactured by screw machineing with a square tail portion attached to the cylindrical socket so that the tail of each contact can receive wire wrapped interconnection. Additionally, if the contact tail is to receive an interconnecting female portion, the tail must be rotationally oriented so that the square faces of the tail engage corresponding square faces of the female socket portion. Thus, it is highly desirable from a manufacturing standpoint to provide integrated circuit contacts attached to a carrier strip and held so that two of the square sides of the contact tail are parallel to the length of the carrier strip and two are perpendicular to the strip. Once the contacts are mounted to the carrier strip, the contacts may be further processed such as by selective plating, or installation into an insulator.

In the past, lead clips having resilient tines have been manufactured as part of a continuous carrier strip and, while on the strip, are rotationally oriented with respect to one another. The clips on the strip are inserted into open ends of the sockets one at a time and then the assembled contact is cut free for subsequent processing. Once the clips are cut free from the carrier strip, all rotational orientation of the contact is lost.

The method and apparatus of the present invention produces a plurality of lead clips having resilient tines rotationally oriented parallel to the axis of the strip for mounting into receiving apertures. Additionally, the method and apparatus of the present invention produces a plurality of strip mounted integrated circuit connector contacts having the square tail portions of the sockets oriented with respect to the axis of the strip and including inner clips having resilient tines installed into the socket portions of the contact with the square tip end portions of the tines oriented parallel to the sides of the square tails and, thereby, with respect to the axis of the strip.

SUMMARY OF THE INVENTION

The invention relates to a method and apparatus for rotationally orienting and affixing lead clips to projections on a carrier strip. The invention also includes, thereafter, affixing contact sockets to the carrier strips after having rotationally oriented the sockets with respect to the axis of the carrier strip.

More particularly, one aspect of the system of the invention includes the method and apparatus for orienting component lead engaging clips having inwardly and downwardly extending tines with respect to the longitudinal axis of a carrier strip. The method and apparatus comprises an orientation plate having adjacent apertures formed in the upper surface. The adjacent apertures are spaced from one another a preselected distance for arranging the lead clips in a preselected array. A quantity of loose randomly oriented lead clips are provided in which each of the clips comprise a generally cylindrical ring open at the top and having downwardly extending resilient tines. The clips are placed on the upper surface of the orientation plate for arrangement upon the plate and the plate is vibrated to cause the loose clips to be positioned within the apertures and arranged upon the plate. A carrier strip is provided having a plurality of depending projections adapted for engaging and retaining the lead clips. The lead clips are oriented within the apertures relative to said carrier strip projections and the carrier strip is moved relative to the lead clips to secure the lead clips upon the carrier strip in oriented alignment therewith.

In a further aspect of the invention, the lead clip supporting carrier strip is advanced from its alignment with the orientation plate and a linear array of socket contacts, in a preselected arrangement and rotational orientation, is positioned in alignment beneath the carrier strip. The carrier strip is then moved relative to said contacts to secure the lead clips in selected orientation within the socket portions of the contacts.

BRIEF DESCRIPTION OF THE DRAWING

For a more complete understanding of the present invention and for further objects and advantages thereof, reference may now be had to the following description taken into conjunction with the accompanying drawing in which:

FIG. 1 is a partial cross-section of an integrated circuit connector contact comprising a lead clip positioned within a socket and oriented with respect to the square tail of the socket and also, with respect to the flat faces of a rectangular lead of the integrated circuit package shown in phantom, all in accordance with the teachings of the present invention;

FIG. 2 is a side view of a lead clip which is received into the open end of a socket as shown in FIG. 1;

FIG. 3 is a top view of the lead clip shown in FIG. 2;

FIG. 3A is a top view of an alternate embodiment of the lead clip shown in FIG. 3 wherein the clip has an oval shape;

FIG. 3B is a top view of the lead clip of FIG. 3A after having been installed by interference fit into a round plated through hole in a printed circuit board;

DETAILED DESCRIPTION

Figure 4:
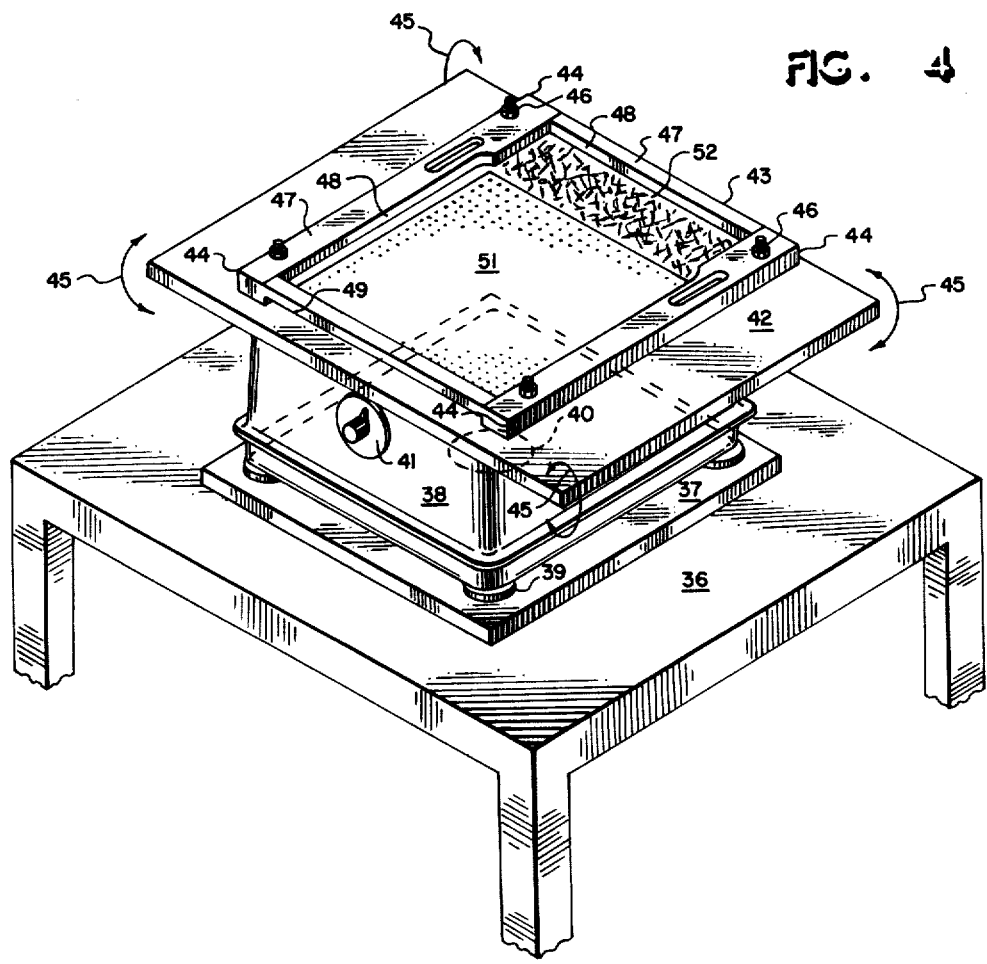
FIG. 4 is a perspective view of a vibrator apparatus for positioning a plurality of lead clips in a rectangular matrix array.

Referring now to FIG. 1, there is shown a partially cut-away side view of an integrated circuit connector contact 21 including a cylindrical upper socket portion 22 having formed at the top thereof a circular overhanging shoulder portion 23. The socket portion of the contact is generally formed by screw machineing. The socket includes an integrated circuit lead receiving opening 24 at the top and a conical lead-in portion 25 to guide integrated circuit lead 30, shown in phantom into the opening 24. Mounted within the interior of the socket portion 26 is a lead retaining clip 27. The contact 21 also includes a circular shank region 28 located just below the cylindrical socket 22 and a square tail 29 at the bottom. The shank region 28 of a finished contact may remain cylindrical for subsequent solder mounting onto a mounting board or it may be transversely upset to form a press fit region in accordance with the teachings set forth in copending U.S. patent application Ser. No. 174,889 filed in the names of J. Preston Ammon and Harry R. Weaver entitled Press Fittable Contacts and Method of Manufacture, and assigned to the assignee of the present invention. The square tail portion 29 of the contact facilitates electrical connection to the contact 21 by wire wrapping and also by means of a female interconnecting plug (not shown) to receive the square tail portion for selective connection therewith.

FIGS. 2 and 3 shown respectively, a side and top view of the lead receiving clip member 27 which is to be received within the cylindrical inside socket portion 26 of the contact 21. The clip 27 comprises a cylindrical upper portion 31 having an upper edge 32 and an opening down the middle. The clip 27 is preferably formed of a thin ring of conductive material, such as copper, and has depending from the upper portion 31 thereof, a plurality of integrally formed, inwardly and downwardly extending resilient tines 33. Each tine 33 comprises a flat, rectangular, planar surface having a square end including a straight lower edge 34. The lower edges 34 of the four tines 33 all come together at the bottom of the clip 27 so as to form a square opening through which a component lead will extend by resiliently deflecting the tines 33 outwardly.

As will be more fully discussed below, the clip configuration shown in FIGS. 2 and 3 are particularly adapted for engaging component leads having a rectangular cross-section in a manner so that the straight edges 34 of each of the tines 33 will each flushly engage a planar surface of a four sided rectangular lead.

A principal object of the present invention is to rotationally orient both the clips 27 and the sockets 21 with respect to their longitudinal axes so that the planar sides of the square socket tail portions 29 are parallel to the lower edges 34 of the tines 33 of the clips 32 and insert the clips into the sockets 26 while both components are rotationally positioned. Additionally, the clip/socket combination is also rotationally oriented with respect to the longitudinal axis of a carrier strip and affixed to that carrier strip so that two of the flat faces of the square tail portion 29 extend parallel to the axis of the strip.

Referring now to FIG. 4, there is shown a vibratory apparatus for positioning clips in a fixture plate in a rectangular matrix array. The apparatus includes a support table 36 having mounted thereon a tiltable plate member 37. The plate 37 is attached to the table 36 by means of a ball and socket joint 40 located near the center so that the plate 37 can tilt from the horizontal several degrees in any direction. The plate 37 mounts a conventional vibrator mechanism 38 resting on four rubber feet 39 and including a control 41 for varying the amplitude of vibration. The frequency of vibration is preferably on the order of about 60 Hz. The vibrator 38 has mounted on its upper surface a positioning board 42 which in turn supports a holding fixture 43. The positioning board 42 includes four corners 44 for gripping by an operator and for tilting in any direction, as is indicated generally by the arrows 45. The holding fixture 43 is mounted to the board 42 by a plurality of bolts 46 and includes four rectangular borders 47 having generally vertically extending side walls 48. The fixture 43 also includes a front opening 49 through which a lead clip orientation plate 51 is inserted and removed and a clip supply reservoir comprising a flat surface 52 for receiving a plurality of individual disoriented clips for subsequent positioning in a rectangular matrix array within the orientation plate 51.

Figure 5:
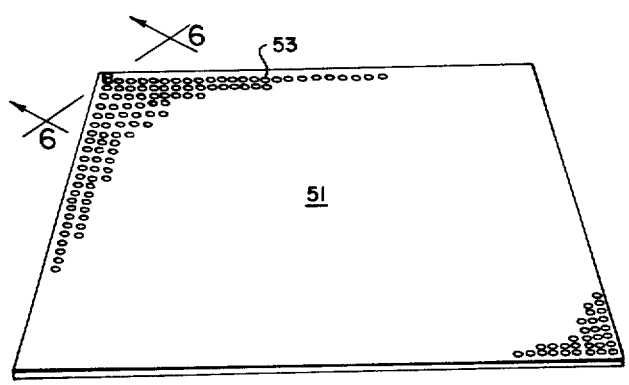
FIG. 5 is a fragmentary perspective view of a fixture plate used for positioning lead clips in a rectangular matrix array.
Figure 6:
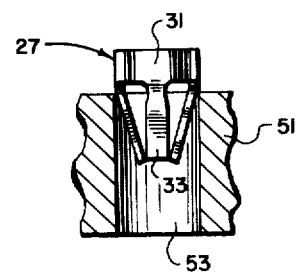
FIG. 6 is a cross-section of one of the holes in the orientation fixture of FIG. 5 having a clip positioned therein.

Referring briefly to FIG. 5, there is shown an illustrative fragmentary view of a clip orientation plate 51. The plate typically includes a plurality of circular apertures 53 oriented in orthogonal rows and columns which may extend 100 apertures in each orthogonal direction to comprise a total of 10,000 apertures formed in the upper surface of the orientation plate 52. The apertures 53 are preferably slightly smaller than the diameter of the cylindrical upper portion 31 of a clip 27. As shown in FIG. 6, when a clip 27 is positioned within an aperture 53 the tines extend down into the opening so that the center of gravity of the clip is below the surface of the plate 51. Referring back to FIG. 4, an orientation plate 51 is inserted into the fixture 43 by means of the opening 49 and a plurality of individual, disoriented clips are placed on the flat clip supply reservoir 52. By way of example, approximately 15,000 clips may be placed on the supply surface 52 to efficiently fill an orientation plate 51 having 10,000 openings therein. After the clips are placed in the fixture 43, the vibrator 38 is energized which vibrates the plate 51 and produces vibration of the clips in a sort of "dancing" motion on the surfaces of the orientation plate 51 and the supply reservoir 52. An operator grasps the corners 44 and tilts the plate 37 from the horizontal so as to cause the loose clips to move across the surface of the orientation plate 51 into regions having unfilled apertures. Experience has shown that within approximately five to six minutes substantially all of the 10,000 apertures 53 will be filled by lead clips 27 each of which is positioned with respect to the plate 51 as shown in FIG. 6. Any few remaining openings may be filled by hand with a pair of tweezers.

Figure 7:
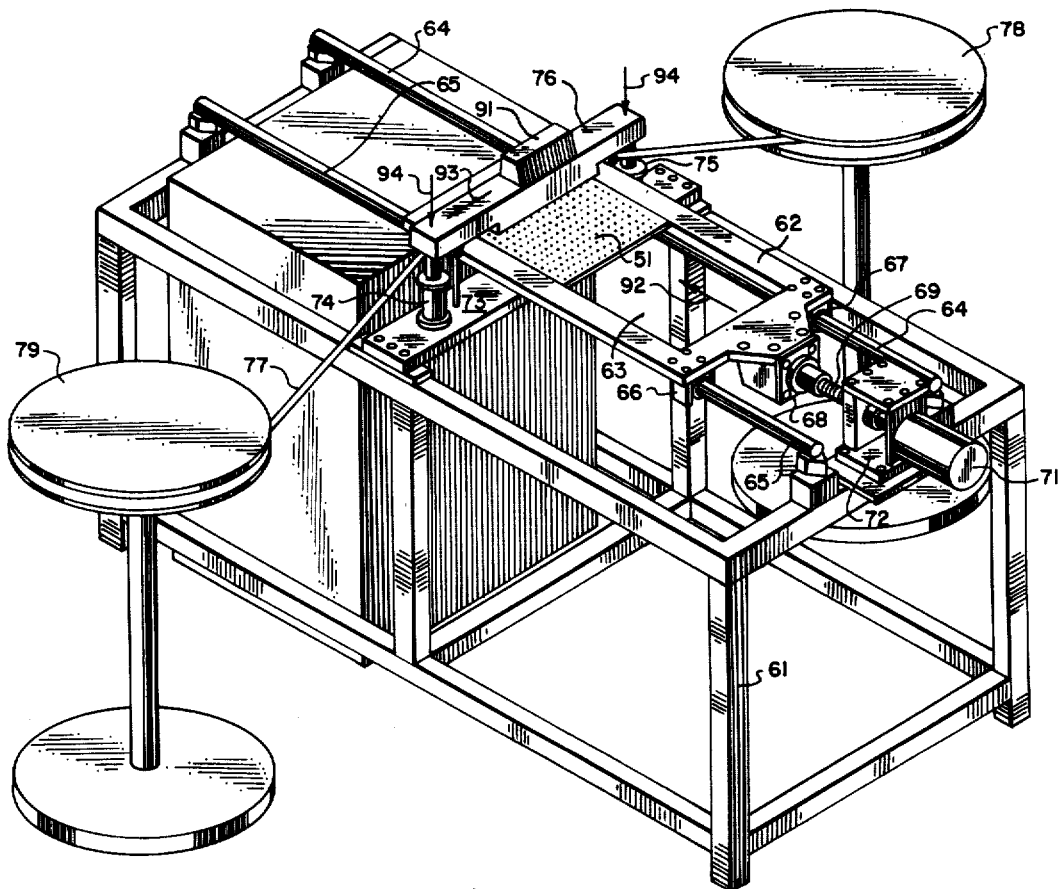
FIG. 7 is a perspective view of an apparatus for rotationally orienting clips with respect to a linear carrier strip and mounting the clips on projections formed on that carrier strip.

Once an orientation plate 51 has been filled with lead clips, the plate is next placed into the clip orienting apparatus of FIG. 7. The clip installation mechanism includes a framework table 61 and a moveable orientation plate support frame 62. The frame 62 receives two clip orientation plates 51 one of which is shown in position with an opening 63 for receiving a second plate. The frame 62 is mounted to a pair of longitudinally extending rods 64 and 65 by means of two pairs of slide bearings 66 and 67, one of which is not shown. The framework 62 also includes a screw threaded fixture 68 which meshes with a centrally extending threaded rotatable shaft 69 affixed at one end to a stepping motor 71 through support box 72. A mounting plate 73 extends transversely across the frametable 61 beneath the mounting frame 62 and supports a pair of pneumatic cylinders (not shown). The piston member of each of the cylinders are guided by bearings 74, 75, and affixed to a transversely extending strip support fixture 76 which supports and guides an elongate carrier strip 77 wound from reel 78 to reel 79.

Figure 8:
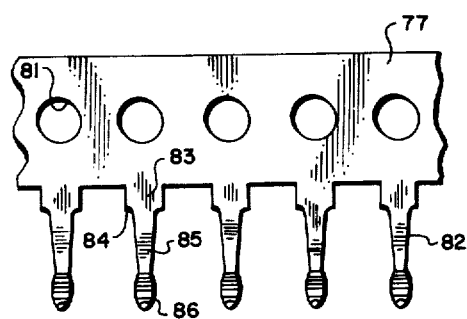
FIG. 8 is a side view of a carrier strip used in conjunction with the present invention.
Figure 9:
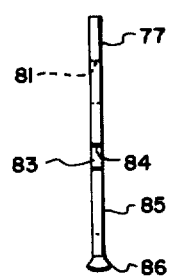
FIG. 9 is an end view of the carrier strip of FIG. 8.

The carrier strip 77 is shown in FIGS. 8 and 9 and comprises a thin ribbon of metal, such as phosphor-bronze, or brass having been processed by a progressive die to form a plurality of equally spaced tooling holes 81 and downwardly extending projections 82. Each of the projections 82 includes an upper portion having parallel walls 83 joined to a square shoulder portion 84 and a tapering finger member 85. Preferably, the projections 82 are formed so that the front and back surfaces of the finger members 85 are parallel to one another and to the longitudinal axis of the strip 77. Likewise, the surfaces of the sides of the finger members 85 lie in a plane perpendicular to the longitudinal axis of the strip 77. When the strip is viewed from an end view shown in FIG. 9, it can be seen that each of the projections 82 also preferably include at the tip of the finger 85 a small enlargement 86, the function of which will be explained below.

Referring back to FIG. 7, the strip support bar also includes an intermittently operated vibrator 91. In operation, a full clip orientation plate 51 is placed into the location shown in the framework 62 and a second full clip orientation plate (not shown) is placed in the adjacent opening 63 within the framework 62. As mentioned above, the apertures within the orientation plates 51 are preferably formed on 0.100 inch centers so that movement of the framework 62 a distance of 0.100 inch in the direction of the arrow 92 will bring successive ones of the rows of the clips past a position below the strip support bar 76. Preferably, the stepping motor 71 is adapted to index the framework 62 an increment of 0.200 inch with each increment of operation. In this manner, movement of the framework 62 in 0.200 inch increments in the direction of arrow 92 will skip every other row of clips until half of the clips from the two adjacent plates will have been processed by the time the framework 62 had made one linear transverse beneath the strip support bar 76. The mechanism then increments 0.100 inch and then repeats the 0.200 increments to process the other half of the clips from the plate (not shown) in the opening 63 and then begin the processing of the remaining half of the clips from plate 51. At this point, a plate having been positioned in the opening 63 would be totally processed and a full plate could be then placed in the opening while the remaining plate 51 was being completed. Thus, the machine of FIG. 7 would never have to be stopped in order to reload full clip orientation plates 51.

In general operation, the strip 77 is advanced in the direction of the arrow 93 in increments of 100 projections each. A portion of the carrier strip having empty projections is advanced into the support bar 76 so that one carrier strip projection 82 is positioned above the open center of each lead clip in a linear array of 10 clips. The strip support bar 76 is then moved downwardly in the direction of arrow 94 while it is being vibrated so as to position 100 clips upon the 100 depending projections on that portion of the strip. When the support bar 76 is raised, the strip is again incremented in the direction of arrow 93 by 100 projections and the clip support plate 51 is incremented 0.200 inches (two rows of clips) in the direction of arrow 92.

Figure 10:
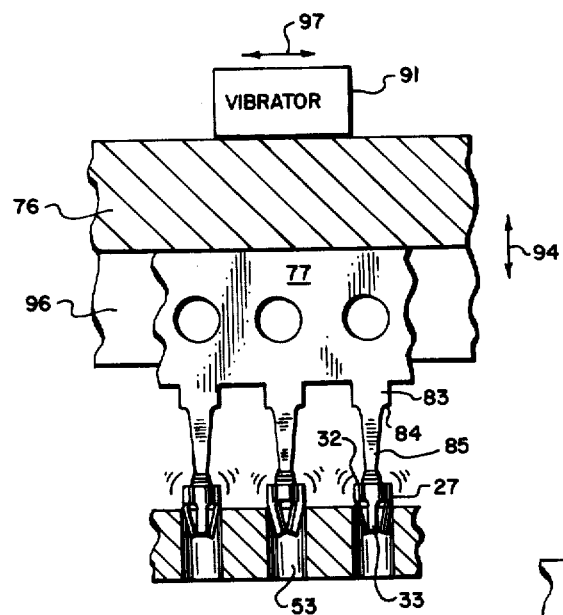
FIG. 10 is an illustrative front view of a carrier strip as the clips are being rotationally oriented on the carrier strip projections.

We now refer to FIG. 10 for a more detailed explanation of the specific operations of orienting and installing clips 27 upon the carrier strip 77. As can be seen in FIG.

10, the support bar 76 includes a longitudinal channel 96 for receiving the upper edges of the carrier strip 77. The support bar 76 is in communication with a vibrator mechanism 91 which preferably applies a vibratory frequency on the order of 60 Hz principally in a direction parallel to the longitudinal axis of the carrier strip, i.e., generally in the direction of arrows 97. In operation, the projections 85 are each positioned in vertical alignment with the central axis of a lead clip 27. The strip support bar 76 is lowered in the direction of arrow 94 until the tip of each projection 85 has barely passed into the open end of each socket 27. It should be noted that the enlargements 86 at lower ends of the projections 85 also includes side walls which are substantially orthogonal with respect to one another so as to be generally square or rectangular in cross-section and orthogonal to the axis of the carrier strip.

By means of precisely controlled movement of the strip within the support bar 76 and of the orientation plates support frame 62, a projection 85 is positioned above the center of the open end of each clip 27 supported in a row of holes 53 formed within the support plate 51. The strip support bar 76 is then lowered so that the lower tip end of each of the projections extends just into the open end of the clip and pauses briefly. Next, the vibrator 91 is energized to produce oscilation of the strip in the direction of the arrows 97 and the vibrating projections 85 are then lowered into engagement with the inside surfaces of the tines 33 formed on each of the clips 27. It has been found that contact of the clips by the vibrating projections causes the clips 27 to immediately rotate within the holes 53 so that the lower ends of the tines orient themselves so that the straight lower edge 34 of each tine 33 is parallel to and flushly engages one of the of the four flat surfaces formed at the lower end of each of the projections 85. The vibrating projections 85 are then pressed further into the clips 27 so that one clip is received up onto each projection 85 until the upper circular edge 32 of each clip is in engagement with the shoulder portion 84 of each projection. The slightly bulbous enlargement 86 at the tip end of each projection 85 serves as a restraining means to aid in insuring that each of the clips 27 received up onto a projection will remain in place.

Figure 11:
FIG. 11 is an illustrative view of a carrier strip having rotationally oriented clips mounted thereon.

The illustration of FIG. 11 shows the manner in which clips 27 are received onto the projections 85 of the strip 77. The strip 77 having clips thereon, is then advanced in the direction of the arrow 93 (FIG. 7) and is wound upon the take up reel 79 for subsequent processing as will be discussed below. Following rotational orientation and installation of a row of clips onto a group of projections, the strip 77 is then advanced in the direction of arrow 93 and the fixture 62 is advanced in the direction of arrow 92 to bring another group of 100 clips into vertically spaced axial alignment with another group of 100 projections for rotational orientation and installation thereon as has been described.

Figure 12A:
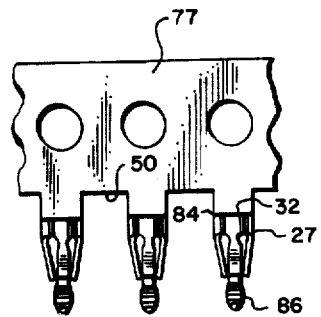
FIG. 12A is a partially cut-away front illustrative view of oriented clips on a strip positioned in a fixture prior to installing those clips into plated through holes in a printed circuit board.
Figure 12A:
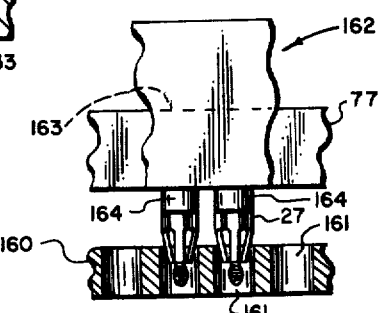
Figure 12B:
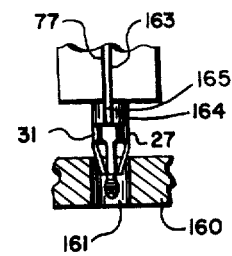
FIG. 12B is a partially cut-away end view of the oriented clips on a strip shown in FIG. 12A.

Once the clips 27 are rotationally oriented with respect to the longitudinal axis of the carrier strip 77, as described above, they may be further processed into integrated circuit connector sockets, as described below, or utilized directly. For example, the oriented clips 27 may be installed directly into plated holes in a printed circuit board substrate to form an integrated circuit connector thereon. Referring to FIG. 12A and 12B there are shown fragmentary, partially cut-away illustrative front view and end views, respectively, of a conventional printed circuit board substrate 160 having a plurality of plated through holes 161 formed therein. The holes 161 are formed in lineaer arrays on the same center lines spacings as the projections 82 of the corner strip 77. A clip press fitting tool 162 comprises a block of metal having a linear groove 163 formed therein for receiving the strip 77. At the lower edge of the tool 162 are formed a plurality of cylindrical projections 164 each having an outer diameter slightly smaller than the outside diameter of the cylindrical portion 31 of the clips 27. The projections 164 also each include a central groove 165 for receiving the strip 77. The flat lower edges of the cylindrical projections 164 each abutt the upper circular edges 32 of each of the clips 27 so as to be able to transfer a downward force from the tool 162 to the clips 27.

As shown in FIGS. 12A and 12B as strip 77 having oriented clips 27 affixed thereto is inserted into the linear grooves or slot 163 of the tool 162 so that the cylindrical projections 164 abutt the tops of the clip 27. The tool is lowered to press fit one oriented clip 27 into each of the plated through holes 161 in the printed circuit board substrate 160. The strip 77 is then removed. The clips 27 are held within the apertures 161 by interference fit with the plated walls thereof. More particularly, the preferred embodiment of lead clip is that shown in FIG. 3A, having a somewhat oval upper portion so that there is a snug interference fit when the clip is press fitted into a round plated through hole in a printed circuit board as shown in FIG. 3B.

Figure 13:
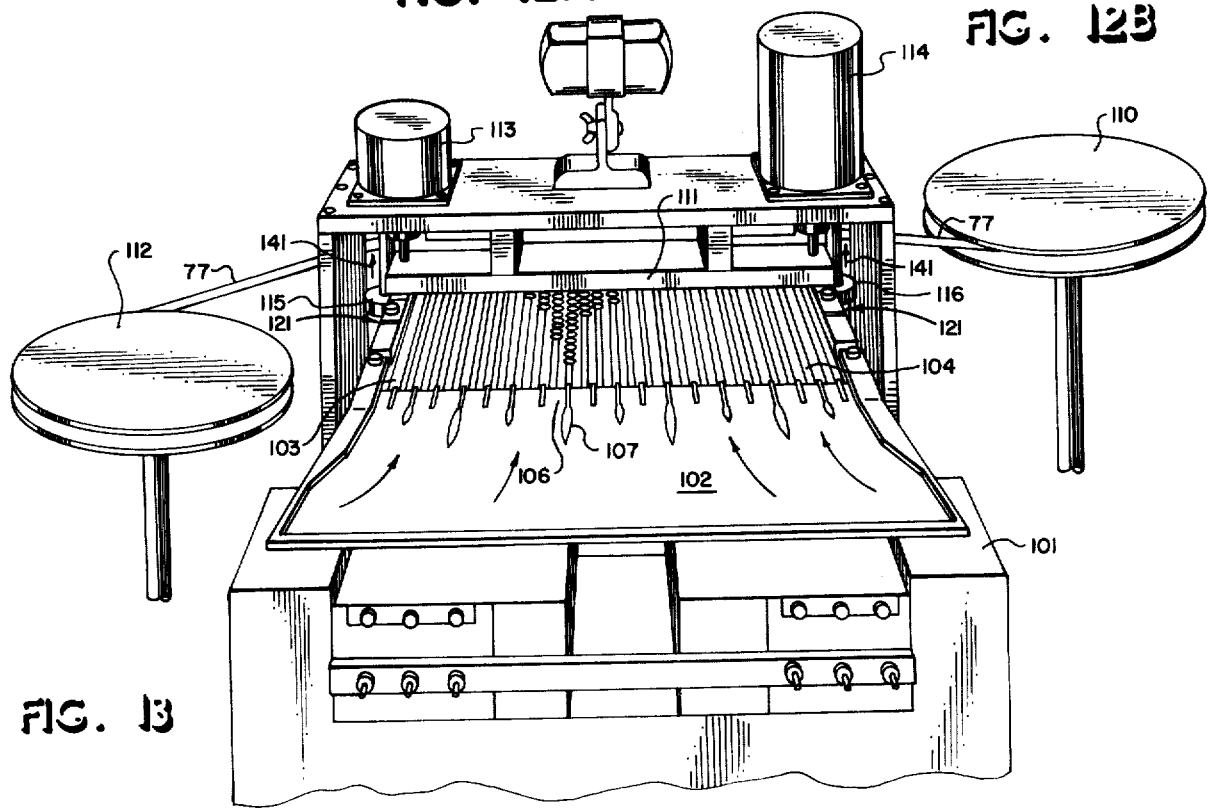
FIG. 13 is a perspective view of an apparatus for positioning linear arrays of connector contact sockets and rotationally orienting the sockets with respect to the carrier strip.
Figure 14:
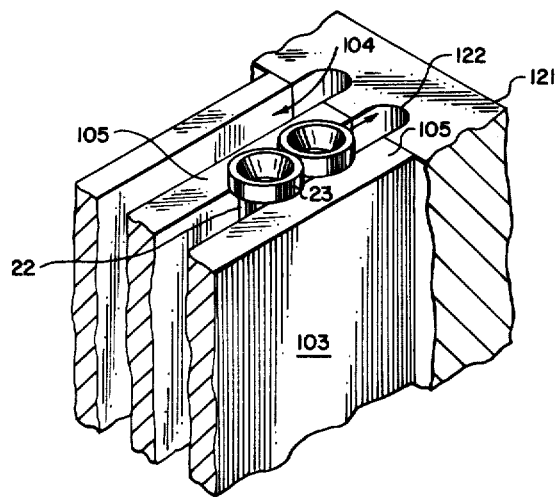
FIG. 14 is a fragmentary perspective view of a feeding track and socket of the apparatus of FIG. 13.

Referring next to FIG. 13, there is shown an apparatus adapted for the orientation and installation of lead receiving socket portions 22 onto the rotationally oriented lead clips 27 previously affixed to the carrier strip 77 to form contacts 21. The apparatus of FIG. 13 includes a framework 101 having a support bed 102 mounted thereon at a slight angle from the horizontal, for example, ten degress. The support surface 102 has mounted thereon a feed track plate 103. The plate 103 includes a plurality of spaced, parallel, socket receiving feed tracks 104 for supporting, guiding and feeding a plurality of rows of contact sockets 22 to an orientation and installation fixture. Referring briefly to FIG. 14, there is shown a fragmentary, illustrative, cut-away view of a single feed track 104 formed in the feed track plate 103 and having a socket member 22 positioned therein. The width of the track 104 is slightly greater than the diameter of the cylindrical socket portion 22 and slightly less than the width of the upper cylindrical shoulder portion 23 so that each contact socket 21 is supported only by the upper surface 105 of the feed track support plate 103 and is free to move linerly along the feed track 104. Moreover, the surface of the feed track support plate 103 is vibrated to assist in feeding a row of contact sockets 22 down each of the feed tracks 104. A contact loading guide plate 106 is positioned above the leading edge of the feed track plate 103 and has a flat support surface with a plurality of upwardly extending guide fences 107. Quantities of loose disoriented socket members are placed on the surface 106 and by means of gravity and intermittent vibration are caused to feed into and down the feed tracks 104 formed in the plate 103.

Figure 15:
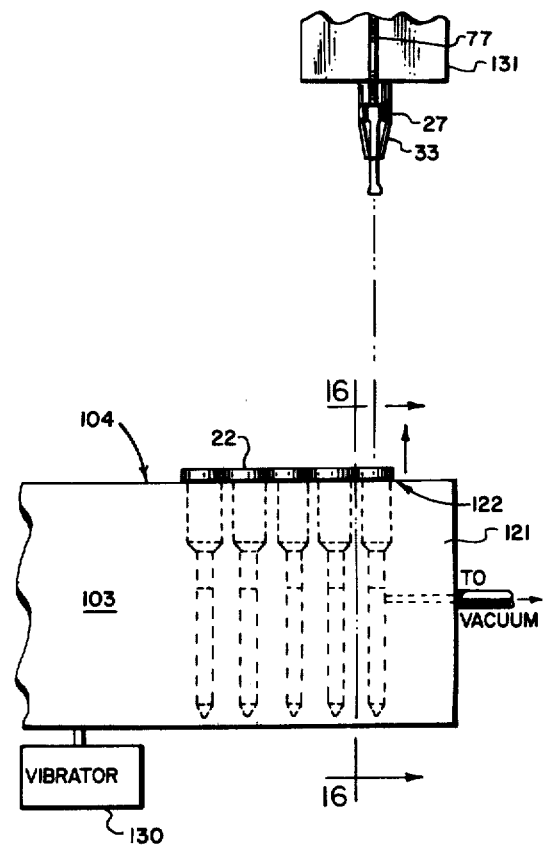
FIG. 15 is a partially cut-away illustrative side view of a feeding track and a socket orientation fixture constructed in accordance with the invention.

A supply reel 110 feeds a carrier strip 77, having lead clips 27 affixed thereto as discussed above, into a strip guide member 111. The finished strip 77 is wound upon a take up reel 112. A pair of strip transport motors 113 and 114 serve to index the strip while a pair of pneumatic cylinders 115 and 116 have pistons which are attached to a socket orientation fixture 121 as illustrated in detail in FIG. 15. As shown, the feed track 104 in the plate 103 moves a row of sockets 22 toward the lower, right-most edge of the plate 103. Abutting the plate 103 along the lower, right-most edge thereof is a socket orientation and installation fixture 121 having an orientation nest 122 in alignment with each of the feed tracks 104 to receive a socket from each one.

Figure 16:
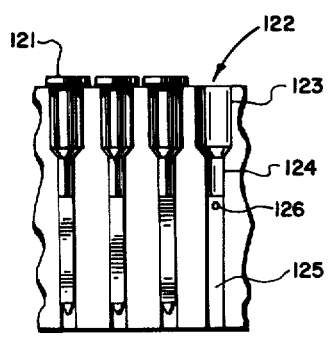
FIG. 16 is an illustrative front view of the socket orientation fixture of FIG. 15.

Looking now to FIG. 16, we see a fragmentary front illustrative view of the orientation and installation fixture 121 illustrating the plurality of nests 122 recessed into the surface thereof. Each nest 122 includes a semi-cylindrical upper portion 123 and a semi-cylindrical lower portion 124. These two cylindrical portions receive respectively, the cylindrical upper socket portion 22 of the contact and the cylindrical intermediate portion 28 of the contact 21 (FIG. 1). Each nest 122 also includes a square lower portion 125 for receiving the square tail portion 29 of a contact socket. An aperture 126 is formed in the flat rear wall of the square portion 125 of each nest 122. Each of the apertures 126 is in communication with a vacuum source 127, FIG. 17. As can be seen, for a contact socket 22 to be fully positioned within one of the nests 122, it must be rotationally oriented about its own longitudinal axis so that the square tail portion 29 of a contact socket will be received into the square portion 125 of the nest 122. The flat back wall of the square portion 125 of the nest 122 is parallel to the longitudinal axis of the carrier strip 77.

Referring back to FIG. 15, it can be seen that as socket members 22 are advanced down a feed track 104 toward the orientation and installation fixture 121, a socket will abut the front edge of each nest 122 and will fall into that nest if the socket is correctly rotationally oriented. It has been found that a brief burst of vibration from a vibrator 130 affixed to the feed track plate 103 together with the forward pressure applied by the row of sockets aligned and waiting to get into a nest will cause the last socket in the row to quickly rotationally orient itself and fall into the nest 122.

In operation, contact socket memers 22 are placed onto the staging region 106 so as to begin to fill each of the feed tracks 104 in the plate 103. There are preferably 100 parallel feed tracks 104 formed on 0.100 inch centers in the plate 103. There are correspondingly 100 nests 122 each also spaced on 0.100 inch centers from one another in the orientation and installation fixture 121. Vibration and gravity causes the sockets to feed down the tracks 104 so that there is a rotationally oriented contact positioned in each of the nests 122 of fixture 121. Correspondingly, the carrier strip 77, having oriented lead clips 27 attached thereto, is advanced to position a projection and lead clip in vertical alignment above the open end of each of the rotationally oriented socket portions positioned in the fixture 121.

Figure 19:
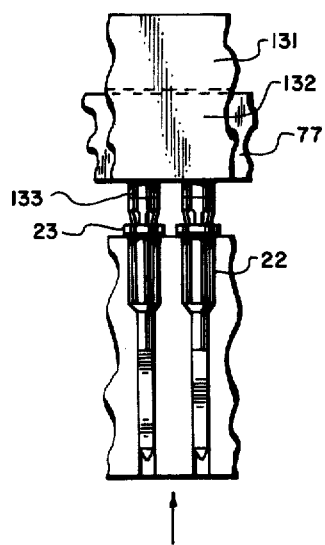
FIG. 19 is an illustrative fragmentary front view of oriented clips being inserted into oriented sockets in accordance with the teachings of the invention.
Figure 20:
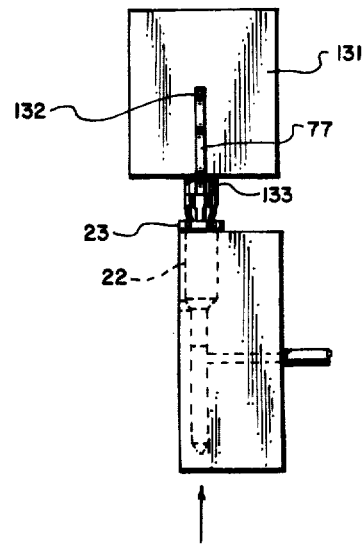
FIG. 20 is an illustrative, fragmentary end view of oriented clips being inserted into oriented sockets in accordance with the teachings of the invention.
Figure 18:
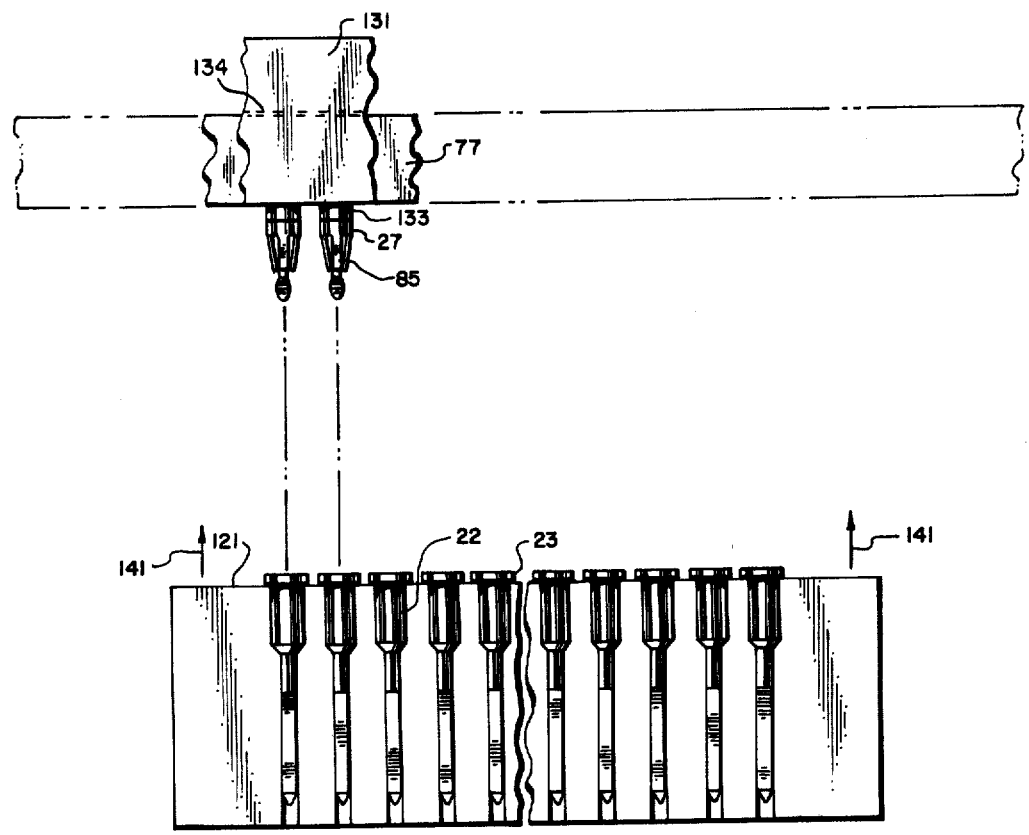
FIG. 18 is a fragmentary illustrative side view of oriented clips on a strip and oriented sockets in the fixture of the apparatus of FIG. 13.

Referring now to FIG. 18, it can be seen, in a fragmentary illustration, how the contact sockets are positioned in the orientation fixture and the clips 27 on the strip 77 are positioned within a strip holding fixture 131. Referring briefly to FIGS. 18 and 19, it can be seen how the strip holding fixture 131 is constructed as a block of metal having a linear groove 132 formed therein for receiving the strip 77. At the lower edge of the fixture 131 are formed a plurality of cylindrical projections 133 each having the same diameter as the outer diameter of the cylindrical portions 31 of the clips 27 and having a central groove 134 for receiving the strip 77. The lower edge of the cylindrical projections 133 each abutt the upper circular edge 32 of each of the clips 27.

Figure 17:
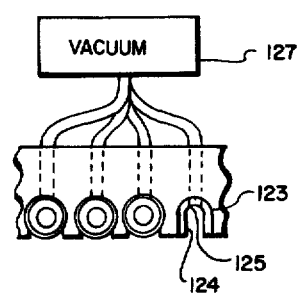
FIG. 17 is an illustrative top view of the socket orientation fixture of FIGS. 15 and 16 having a strip of clips positioned above and in alignment with the sockets.

Referring back to the fragmentary illustration of FIG. 18, it can be seen that the strip 77 is held in a linear orientation directly above the row of contact sockets 22 positioned in the socket orientation and holding fixture 121. The upper edges of the clips 27 are supported by the cylindrical bifurcated pin-like projections 133 and are restrained from movement in the upward direction thereby. Once the clips 27 and sockets 22 are positioned in vertical alignment within their respective fixtures, as illustrated in FIG. 17, the air cylinders (115 and 116 of FIG. 13) are actuated to move the fixture 121 in the direction of arrows 141 until the upper edges of the cylindrical shoulder portion 23 of the sockets 22 abutt the bottom edge 150 of the strip 77. Thus, with the aid of the bifurcated cylindrical projections 133, the clips 27 are installed down into the socket portions 22 to form finished contacts 21. It should also be noted that because the lead clips 27 have been previously rotationally oriented with respect to the axis of the strip 77, both the lead clips 27 and the sockets 22 are properly rotationally oriented such that the straight lower planar edges of the four tines 33 extend in parallel alignment with the four planar sides of the square tail portions 29 of each of the contacts 21. Two of the sides of contact tails 29 are also parallel to the longtudinal axis of the strip 77 while two sides are perpendicular thereto.

Figure 21:
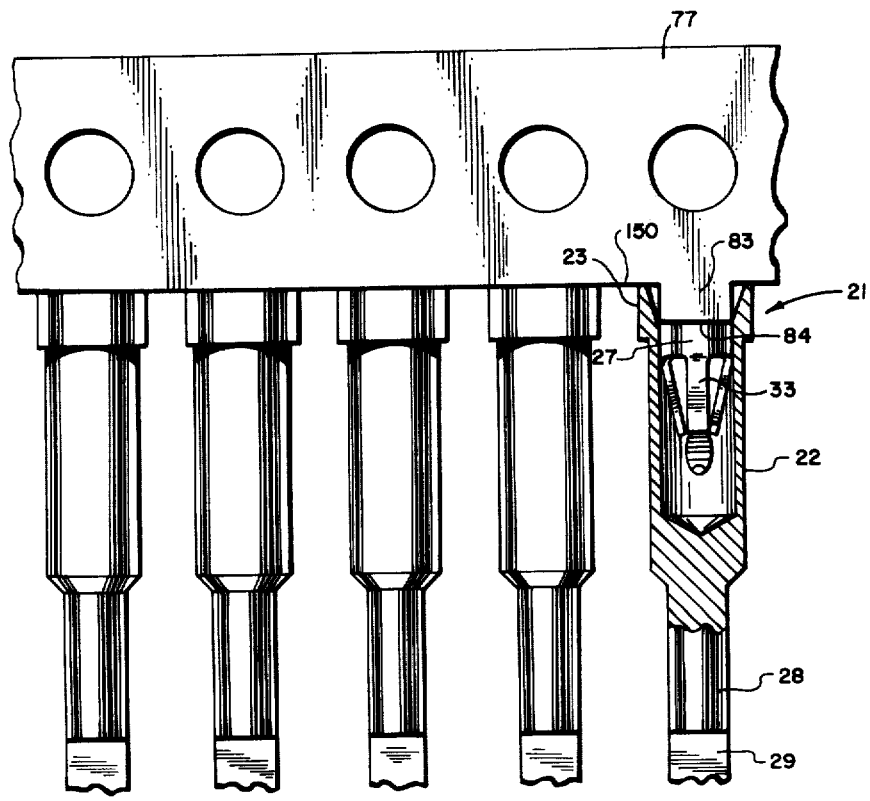
FIG. 21 is a front view of a carrier strip having both clips and sockets oriented with respect to one another and with respect to the longitudinal axis of the carrier strip on which they are mounted; and, FIG. 22 is a side view of a contact having a press fit region formed thereon by upsetting.

Finished contacts 21, comprising oriented clips 27 and sockets 22, affixed to the carrier strip 77 is illustrated in FIG. 21. The strip 77 has affixed thereto a linear array of integrated circuit lead contacts 21 having two of the flat sides of the square tail portions 29 extending parallel to the longitudinal direction of the strip 77 and two extending perpendicular thereto. Additionally, clips 27 are positioned within the open end of the sockets 22 of each contact 21. Each of the clips 27 has the straight lower edge 34 of each of its tines 33 extending parallel to respective ones of the flat faces of the square contact tail portion 29. Thus, when finished oriented contacts with oriented clips are to be installed into insulators or mounting substrates, positioning of the axis of the carrier strip 77 with respect to the axis of the mounting substrate or insulator automatically insures that both the rotational orientation of the socket itself as well as the oriented clip in the socket are all fixed with respect to the orientation of the strip. The strip may thus be used to install the contacts into an insulator or mounting structure. Once contact orientation is established and fixed with respect to an insulator or substrate axis, the orthogonal planar sides of a generally rectangular component lead inserted into the socket resiliently engage the straight lower edges 34 of the tines 33. The tail 29 of the contact 21 is also rotationally oriented with respect to a mounting insulator and to the tails of all the other insulator mounted contacts which thereby facilitates engagement of the tails by automatic wire wrapping apparatus or by the female portions of a socket connector.

An additional advantage of orienting and mounting contacts in accordance with the teachings of the present invention, are that the contacts properly oriented and strip mounted may be further processed in an efficient manner. For example, since the contacts are now on a strip any portion of the contacts may be selectively plated with precious metal in accordance with the desired end use of the contacts. For example, if a contact tail 29 is to be engaged by a female connector member, only the lower tip of the tail would require plating with gold. Strip mounting enables selective plating and obviates the necessity of barrel plating all portions of a loose contact in order to obtain a precious metal surface over small areas where actual electrical interconnections are to be made.

Figure 22:
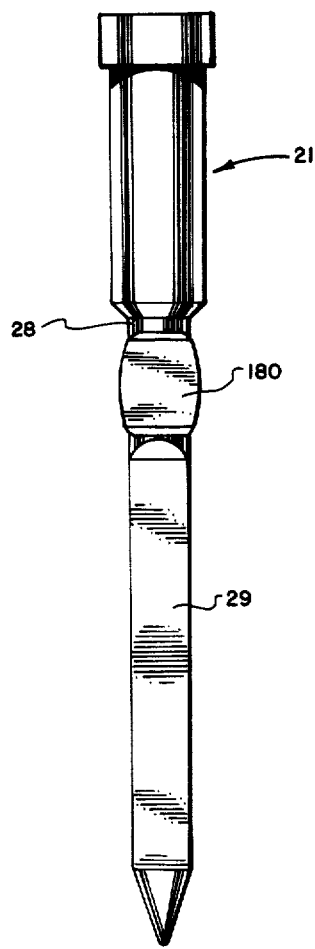

A further advantage of strip mounted oriented contacts may be seen from the contact illustrated in FIG. 22. The contact 21 has had the central cylindrical region 28 upset by a forming die so as to flair the metal and produce a press fittable shank 180 thereon. Strips of contacts may have many contacts swedged with the single swat of a die. An entire row of contacts having press fittable regions found thereon, may be positioned above aligned mounting apertures in a substrate and then all of the contacts press fit simultaneously into those receiving apertures. For contacts to be mounted by press fitting, it may be desirable to selectively plate only the central press fittable region 180 and thereby eliminating a waste of gold by plating more of the contact than is actually necessary to facilitate the desired end use.

It is thus believed that the operation and construction of the present invention will be apparent from the foregoing description. While the method and apparatus shown and described has been characterized as being preferred it will be obvious that various changes and modifications may be made therein without departing from the spirit and scope of the invention as defined in the following claims.

What is claimed is:

1. A method of mounting oriented socket contacts for an electrical connector wherein each of said contacts comprises a socket portion including a lead clip having inwardly and downwardly extending tines in oriented relationship with a lower tail portion of the contact, said method comprising the steps of:
   providing an orientation plate having adjacent apertures formed in the upper surface, said adjacent apertures being spaced from one another a preselected distance for arranging said lead clips in a preselected array;
   providing a quantity of loose randomly oriented lead clips, each of said clips comprising a generally cylindrical ring open at the top and downwardly extending resilient tines;
   placing said clips on the upper surface of said orientation plate for arrangement upon said plate;
   vibrating said plate to cause the loose clips to be positioned within said apertures and arranged upon said plate;
   providing a carrier strip having a plurality of depending projections adapted for engaging and retaining said lead clips thereto;
   orienting said lead clips within said apertures and relative to said carrier strip projections;
   moving said carrier strip relative to said lead clips and securing said lead clips upon said carrier strip in oriented alignment therewith;
   advancing said lead clip supporting carrier strip from alignment with the orientation plate;
   positioning socket contacts in preselected arrangement and rotational orientation in alignment with said carrier strip; and
   moving said carrier strip relative to said contacts to secure said lead clips within the socket portion of said contacts in select orientation therebetween.

2. The method as set forth in claim 1 wherein the step of providing a carrier strip includes positioning said carrier strip above said lead clips with one depending projection in vertical alignment with each clip.

3. The method as set forth in claim 2 wherein the step of orienting said lead clips includes the steps of vibrating said clips and moving said carrier strip relative to said vibrating clips to cause said clips to engage said depending projections and become oriented and secured thereto.

4. The method as set forth in claim 3 wherein said depending projections include finger portions having adjacent sides lying in orthogonal planes to one another for engaging and orienting the resilient tines of said clips.

5. The method as set forth in claim 1 wherein the step of providing an orientation plate includes the step of providing said apertures with side walls adapted for receiving and engaging the side walls of the cylindrical ring portions of said lead clips during vibration.

6. The method as set forth in claim 4 wherein said resilient tines of said lead clips include straight lower edges wherein said edges of opposing resilient tines are in parallel spaced relationship.

7. The method as set forth in claim 5 wherein said lead clips include at least 2 pair of resilient tines.

8. A method of orienting component lead engaging clips having inwardly and downwardly extending resilient tines with respect to the longitudinal axis of a carrier strip, said method comprising the steps of:
   providing an orientation plate having adjacent apertures formed in the upper surface, said adjacent apertures being spaced from one another a preselected distance for arranging said lead clips in a preselected array;
   providing a quantity of loose randomly oriented lead clips, each of said clips comprising a generally cylindrical ring open at the top and having an outer diameter slightly smaller than each of the apertures in said orientation plate, each of said clips also having at least two downwardly extending resilient tines, the lower ends of said tines being opposed to and spaced from one another and lying in planes which coverage;
   placing said clips on the upper surface of said orientation plate for arrangement upon said plate;
   vibrating said plate to cause ones of the loose clips to be positioned with the tines thereof positioned within associated ones of said apertures and arranged upon said plate;
   providing a carrier strip having a plurality of depending projections which include adjacent sides lying in orthogonal planes to one another and to the axis of the carrier strips and adapted for engaging and retaining said lead chips thereto;
   moving said carrier strip relative to said lead clips positioned within the apertures to bring the projections into contact with the tines of the clips and cause each clip to rotate about its longitudinal axis and align the lower ends of the tines with opposed parallel sides of the projections and thereby orient the clips with respect to the axis of the carrier strip; and
   securing said lead clips upon said carrier strip in oriented alignment therewith.

9. The method as set forth in claim 8 wherein the step of providing a carrier strip includes positioning said carrier strip above said lead clips with one depending projection in vertical alignment with each clip.

10. The method as set forth in claim 9 wherein said opposed resilient tines of said lead clips include straight lower edges in parallel spaced relationship.

11. A method of orienting component lead engaging clips having inwardly and downwardly extending resilient tines with respect to the longitudinal axis of a carrier strip, said method comprising the steps of:
- providing an orientation plate having adjacent apertures formed in the upper surface, said adjacent apertures being spaced from one another a preselected distance for arranging said lead clips in a preselected array;
- providing a quantity of loose randomly oriented lead clips, each of said clips comprising a generally cylindrical ring open at the top having downwardly extending resilient tines, said resilient tines of said lead clips which are in opposing relationship having straight lower edges in parallel spaced relationship;
- placing said clips on the upper surface of said orientation plate for arrangement on said plate;
- vibrating said plate to cause the loose clips to be positioned within said apertures and arranged upon said plate;
- providing a carrier strip having a plurality of depending projections adapted for engaging and retaining said lead clips thereto, each of said depending projections of said carrier strip including adjacent four sides lying in orthogonal planes to one another for engaging and orienting the resilient tines of said clips, said carrier strip being positioned above said lead clips with one depending projection in vertical alignment with each clip;
- orienting said lead clips within said apertures and relative to said carrier strip projections by vibrating said clips and moving said carrier strip relative to said vibrating clips to cause said clips to engage said depending projections and become oriented and secured there; and
- moving said carrier strip relative to said lead clips and securing said lead clips upon said carrier strip in oriented alignment therewith.

12. The method as set forth in claim 11 wherein the step of providing an orientation plate includes the step of provided said apertures with side walls adapted for receiving and engaging the side walls of the cylindrical ring portions of said lead clips during vibration.

13. The method as set forth in claim 11 wherein said lead clips include at least 2 pair of resilient tines.

14. A method for mounting oriented component lead clips into socket contacts and affixing the oriented contact assembly to a carrier strip, wherein said lead clips comprise a generally cylindrical ring open at the top and having at least one pair of inwardly and downwardly extending resilient tines, said socket contacts comprise an upper cylindrical body portion including a cylindrical socket opening slightly smaller in diameter than the lead clips and a lower square tail portion, said carrier strip comprising an elongate ribbon having a plurality of transversely extending mounting projections said projections being equally spaced from one another a preselected distance and each projection including a finger smaller in breadth than the opening through said lead clips and at least two straight parallel spaced sides, said method comprising the steps of:
- providing an orientation plate having circular apertures formed in the upper surface with adjacent apertures being spaced from one another a preselected distance;
- discharging a quantity of loose randomly oriented clips upon the upper surface of said orientation plate;
- vibrating said plate while tilting it from the horizontal to cause the loose clips to be positioned with the tines thereof extending into said apertures in linear rows;
- positioning a carrier strip with mounting projections above a row of oriented lead clips and in axial alignment therewith;
- moving said carrier strip relative to said clips to cause said clips to become mounted upon said carrier strip;
- providing an array of oriented socket contacts spaced one from the other in rotational orientation with the longitudinal axis of said carrier strip;
- positioning said carrier strip above said aligned socket contacts; and
- moving said carrier strip relative to said aligned socket contacts to secure said contacts thereon.

15. The method for mounting oriented component lead clips into socket contacts and affixing the oriented contact assembly to a carrier strip as set forth in claim 14 wherein said step of providing an array of oriented socket contacts comprises the steps of:
- providing a fixture having a plurality of equally spaced socket receiving nests, each nest including a cylindrical opening for receiving the socket upper body position and a lower square sided opening for receiving and orienting the square tail of the socket.

16. The method for mounting oriented component lead clips into socket contacts and affixing the oriented contact assembly to a carrier strip as set forth in claim 15, which also includes the steps of:
- providing a plurality of parallel feed tracks each having a width to support the upper cylindrical body portion of a contact and allow the tail portion to depend below said tracks, said tracks being vibrated and terminated at the lower end of each feed track adjacent one of said socket receiving nests to feed sockets into said nests.

17. An apparatus for mounting oriented socket contacts for an electrical connector wherein each of said contacts comprises a socket portion including a lead clip having inwardly and downwardly extending tines in oriented relationship with a lower tail portion of the contact, said apparatus comprising;
- an orientation plate having adjacent apertures formed in the upper surface, said adjacent apertures being spaced from one another a preselected distance for arranging said lead clips in a preselected array;
- means for placing a quantity of loose randomly oriented lead clips, each of said clips comprising a generally cylindrical ring open at the top and downwardly extending resilient tines, on the upper surface of said orientation plate for arrangement upon said plate;
- means for vibrating said plate to cause the loose clips to be positioned within said aperture and arranged upon said plate;
- a carrier strip having a plurality of depending projections adapted for engaging and retaining said lead clips thereto;

means for orienting said lead clips within said apertures and relative to said carrier strip projections;

means for moving said carrier strip relative to said lead clips and securing said lead clips upon said carrier strip in oriented alignment therewith;

means for positioning socket contacts in preselected arrangement and rotational orientation beneath said carrier strip; and means for moving said carrier strip relative to said contacts to secure said lead clips within the socket portion of said contacts in select orientation therebetween.

18. The apparatus as set forth in claim 17 wherein said carrier strip also includes means for positioning said carrier strip above said lead clips with one depending projection in vertical alignment with each clip.

19. The apparatus as set forth in claim 18 wherein the means for orienting said lead clips includes means for vibrating said clips and moving said carrier strip relative to said vibrating clips to cause said clips to engage said depending projections and become oriented and secured thereto;

20. The apparatus as set forth in claim 19 wherein said depending projections include finger portions having adjacent sides lying in orthogonal planes to one another for engaging and orienting the resilient tines of said clips.

21. The apparatus as set forth in claim 17 wherein said orientation plate includes apertures with side walls adapted for receiving and engaging the side walls of the cylindrical ring portions of said lead clips during vibration.

22. The apparatus as set forth in claim 21 wherein said resilient tines of said lead clips include straight lower edges wherein said edges of opposing resilient times are in parallel spaced relationship.

23. The apparatus as set forth in claim 20 wherein said lead clips include at least 2 pair of resilient tines.

24. An apparatus for orienting component lead engaging clips having inwardly and downwardly extending resilient tines with respect to the longitudinal axis of a carrier strip said apparatus comprising;

an orientation plate having adjacent apertures formed in the upper surface, said adjacent apertures being spaced from one another a preselected distance for arranging said lead clips in a preselected array;

means for placing a quantity of loose randomly oriented lead clips, each of said clips comprising a generally cylindrical ring open at the top having downwardly extending resilient tines, on the upper surface of said orientation plate for arrangement upon said plate;

means for vibrating said plate to cause the loose clips to be positioned within said apertures and arranged upon said plate;

a carrier strip having a plurality of depending projections adapted for engaging and retaining said lead clips thereto;

means for orienting said lead clips within said apertures and relative to said carrier strip projections; and means for moving said carrier strip relative to said lead clips to secure said lead clips upon said carrier strip in oriented alignment therewith.

25. The apparatus as set forth in claim 24 wherein said carrier strip includes means for positioning said carrier strip above said lead clips with one depending projection in vertical alignment with each clip.

26. The apparatus as set forth in claim 25 wherein said resilient tines of said lead clips include straight lower edges wherein said edges of opposing resilient tines are in parallel spaced relationship 27. The apparatus as set forth in claim 26 wherein the means for orienting said lead clips includes means for vibrating said clips and moving said carrier strip relative to said vibrating clips to cause said clips to engage said depending projections and become oriented and secured thereto.

28. The apparatus as set forth in claim 27 wherein the means for providing an orientation plate includes apertures with side walls adapted for receiving and engaging the side walls of the cylindrical ring portions of said lead clips during vibration.

29. The apparatus as set forth in claim 27 wherein said lead clips include at least 2 pair of resilient tines.

30. A system for mounting oriented component lead clips into socket contacts and affixing the oriented contact assembly to a carrier strip, wherein said lead clips comprise a generally cylindrical ring open at the top and having at least one pair of inwardly and downwardly extending resilient tines, said socket contacts comprise an upper cylindrical body portion including a cylindrical socket opening slightly smaller in diameter than the lead clips and a lower square tail portion, said carrier strips comprising an elongate ribbon having a plurality of transversely extending mounting projections said projections being equally spaced from one another a preselected distance and each projection including a finger smaller in breadth than the opening through said lead clips and at least two straight parallel spaced sides, said system comprising;

an orientation plate having circular apertures formed in the upper surface with adjacent apertures being spaced from one another a preselected distance;

means for vibrating said plate while tilting it from the horizontal to cause a quantity of loose randomly oriented clips placed upon the upper surface of said orientation plate to be positioned with the tines thereof extending into said apertures in linear rows;

means for positioning a carrier strip with mounting projections above a row of oriented lead clips and in axial alignment therewith;

means for moving said carrier strip relative to said clips to cause said clips to become mounted upon said carrier strip;

means for providing an array of oriented socket contacts spaced one from the other in rotational orientation with the longitudinal axis of said carrier strip;

means for positioning said carrier strip above said aligned socket contracts; and means for moving said carrier strip relative to said aligned socket contacts to secure said contacts thereon.

31. The system for mounting oriented component lead clips into socket contacts and affixing the oriented contact assembly to a carrier strip as set forth in claim 30 which also includes:

a fixture having a plurality of equally spaced socket receiving nests, each nest including a cylindrical opening for receiving the socket upper body portion and a lower square sided opening for receiving and orienting the square tail of the socket.

32. The system for mounting oriented component lead clips into socket contacts and affixing the oriented contact assembly to a carrier strip as set forth in claim 31 which also includes:

a plurality of parallel feed tracks each having a width to support the upper cylindrical body portion of a contact and allow the tail portion to depend below said tracks, said tracks being tilted with respect to the horizontal and terminated at the lower end of each feed track adjacent of said socket receiving nests to feed sockets into said nests.

* * * * *